United States Patent [19]

Shou et al.

[11] Patent Number: 5,396,446
[45] Date of Patent: Mar. 7, 1995

[54] DIGITAL FILTER CIRCUIT THAT MINIMIZES HOLDING ERRORS TRANSMITTED BETWEEN HOLDING CIRCUITS

[75] Inventors: Guoliang Shou; Weikang Yang; Sunao Takatori; Makoto Yamamoto, all of Tokyo, Japan

[73] Assignee: Yozan Inc., Tokyo, Japan

[21] Appl. No.: 155,809

[22] Filed: Nov. 23, 1993

[30] Foreign Application Priority Data

Nov. 24, 1992 [JP] Japan ................... 4-337987

[51] Int. Cl.[6] ................ G06G 7/02; G06J 1/00
[52] U.S. Cl. .................... 364/825; 364/602
[58] Field of Search ............ 364/825, 602, 606, 724.17

[56] References Cited

U.S. PATENT DOCUMENTS

| | | | |
|---|---|---|---|
| 4,316,258 | 2/1982 | Berger | 364/825 |
| 4,476,539 | 10/1984 | Tamori et al. | 364/825 |
| 4,605,913 | 8/1986 | Pfleiderer et al. | 364/825 |
| 4,700,345 | 10/1987 | Morcom et al. | 364/825 |
| 5,272,663 | 12/1993 | Jones et al. | 364/825 |

OTHER PUBLICATIONS

Massara, "Synthesis of Low-Passs Forms", The electrical Engineering Handbook pp. 674–691, undated.

*Primary Examiner*—Tan V. Mai
*Attorney, Agent, or Firm*—Cushman, Darby & Cushman

[57] ABSTRACT

A filter circuit that controls holding errors so that such errors are held to a minimum. In the filter circuit, multipliers of multiplication circuits are stored in a shift register and multiplication is successively executed with various multipliers in a multiplication circuit by circulating multipliers in the shift register.

6 Claims, 4 Drawing Sheets

DIGITAL FILTER CIRCUIT THAT MINIMIZES HOLDING ERRORS TRANSMITTED BETWEEN HOLDING CIRCUITS

FIELD OF THE INVENTION

The present invention relates "a digital filter", which is a filter circuit for holding a plurality of successive input data in time series and for accumulating the data in time series after multiplying the data by a multiplier.

BACKGROUND OF THE INVENTION

Conventionally, there has been a possibility that holding errors in analog data were accumulated in such kind of a filter circuit because data is transmitted between holding circuits.

SUMMARY OF THE INVENTION

The present invention solves the problem with conventional holding circuits and provides a filter circuit that controls holding errors to a minimum.

In the filter circuit in this invention, a multiplier of each multiplication circuit is stored in a shift register and multiplication is successively executed with various multipliers in a multiplication circuit by circulating multipliers.

PREFERRED EMBODIMENT OF THE PRESENT INVENTION

Hereinafter an embodiment of a filter circuit according to the present invention will be described with reference to the attached drawings.

Figure 1:
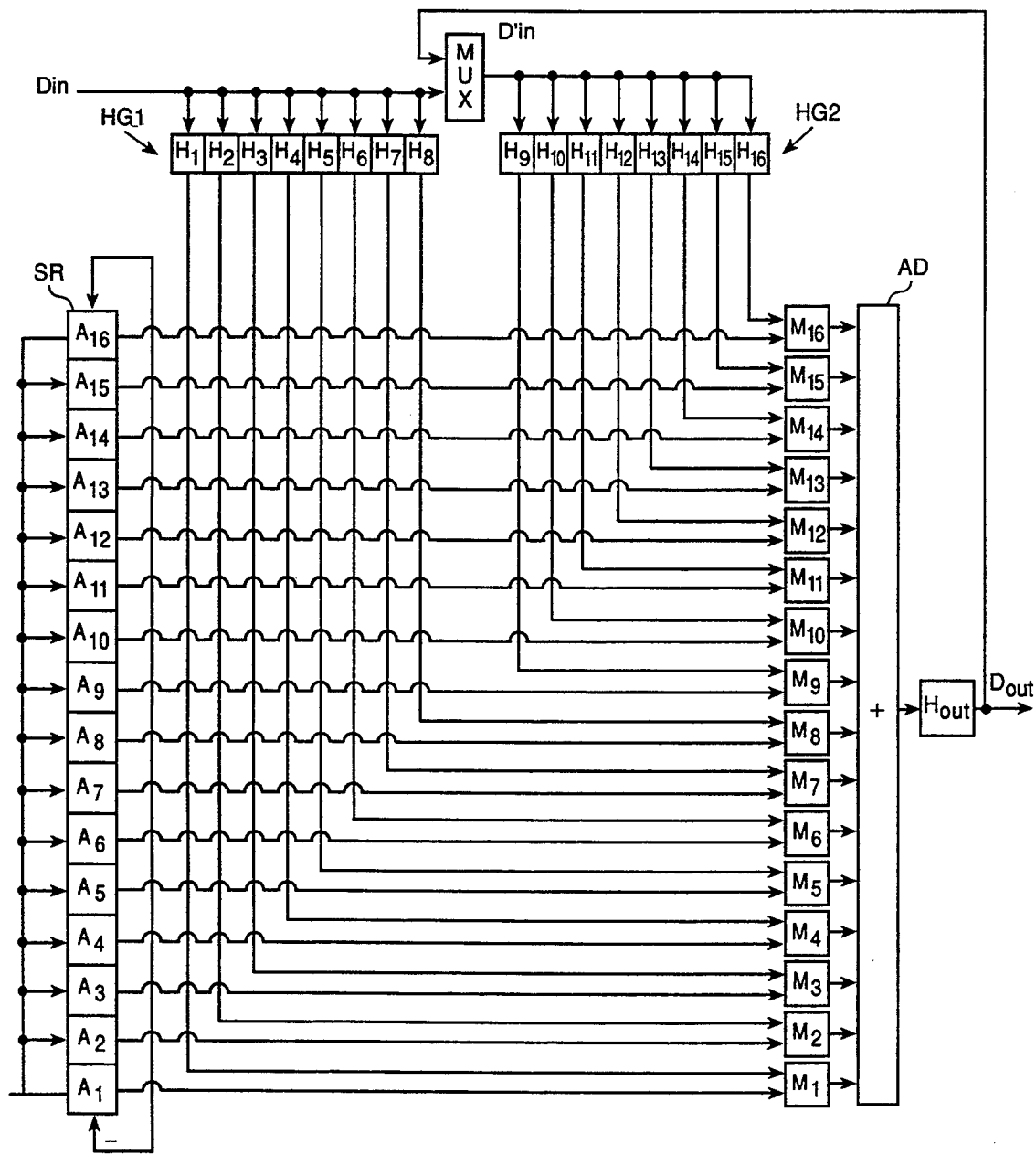
FIG. 1 is a block diagram of a first embodiment of a filter circuit of the present invention.

The filter circuit in FIG. 1 comprises a plurality of holding circuits "$H_1$" to "$H_{16}$", each of which provides an output to a corresponding multiplication circuit "$M_1$" to "$M_{16}$", respectively. Each data area "$A_1$" to "$A_{16}$" of a shift register "SR" is connected to each multiplication circuit "$M_1$" to "$M_{16}$", respectively. The data in these data areas is used as a multiplier on the data in the holding circuits.

The output of multiplication circuits from "$M_1$" to "$M_{16}$" are summed in an addition circuit "AD". Consequently, the total summation of the outputs of multiplication circuits $M_1$–$M_{16}$ are calculated.

When input data "$D_{in}$" is input to holding circuits "$H_1$" To "$H_{16}$", all necessary data in time series can be obtained by predetermined timing without transmitting data between holding circuits by repeating i) holding data of "$D_{in}$" in time series in sequence from "$H_1$" to "$H_{16}$", ii) holding next data in time series in sequence in the same way.

The multiplier on the data of each holding circuit is shifted when data is newly started holding from "$H_1$" after holding circuits from "$H_1$" to "$H_{16}$" are satisfied by a pair of data in time series.

TABLE 1

|  | H1 | H2 | H3 | H4 | H5 | H6 | H7 | H8 | H9 | H10 | H11 | H12 | H13 | H14 | H15 | H16 |
|---|---|---|---|---|---|---|---|---|---|---|---|---|---|---|---|---|
| The First Multiplier | d1 | d2 | d3 | d4 | d5 | d6 | d7 | d8 | d9 | d10 | d11 | d12 | d13 | d14 | d15 | d16 |
|  | m1 | m2 | m3 | m4 | m5 | m6 | m7 | m8 | m9 | m10 | m11 | m12 | m13 | m14 | m15 | m16 |
| The Second Multiplier | d17 | d2 | d3 | d4 | d5 | d6 | d7 | d8 | d9 | d10 | d11 | d12 | d13 | d14 | d15 | d16 |
|  | m16 | m1 | m2 | m3 | m4 | m5 | m6 | m7 | m8 | m9 | m10 | m11 | m12 | m13 | m14 | m15 |
| — | — | — | — | — | — | — | — | — | — | — | — | — | — | — | — | — |
| — | — | — | — | — | — | — | — | — | — | — | — | — | — | — | — | — |

As shown in TABLE 1, the multiplier is shifted to the next multiplication and the multiplier in the ending multiplication is returned to the beginning muliplication.

The error of holding caused by transferring between holding circuits can be avoided by such structure.

Holding circuits from "$H_1$" to "$H_{16}$" are classified into the first holding circuit group "HG1" and the second holding circuit group "HG2". The holding circuits from "$H_1$" to "$H_8$" belong to "HG1" and the holding circuits from "$H_9$" to "$H_{16}$" belong to "HG2".

Multiplexer "MUX" is connected between "HG1" and "HG2". The input of "HG1" and "HG2" is classified into the first input data "$D_{in}$" and the second input data "$D'_{in}$", respectively.

The output of addition circuit "AD" is held in holding circuit "$H_{out}$", and the output of "$H_{out}$" is fed back to multiplexer "MUX". The first input data "$D_{in}$" or the output of "$H_{out}$" is alternatively input to "HG2" by "MUX", and the input to "HG2" is referred to as "$D'_{in}$".

When "Din" is selected as "D' in", the filter circuit carries out the calculation below, becoming a FIR-type filter.

$$Y(t) = \sum_{i=0}^{15} ai \times X(t - i)$$

"Y(t)" is an output.

"X(t)" and "ai" are multipliers.

When the output of "$H_{out}$" is selected as "D' $_{in}$", it becomes a filter of IIR-type.

As mentioned above, two kinds of filters of FIR and IIR is realized only by switching "SW" in the special use circuit. When FIR type filter is realized, the filter has rather large steps making the best use of all holding circuits and multiplication circuits. A filter of wide use, as well as high speed processing can be realized.

Figure 2:
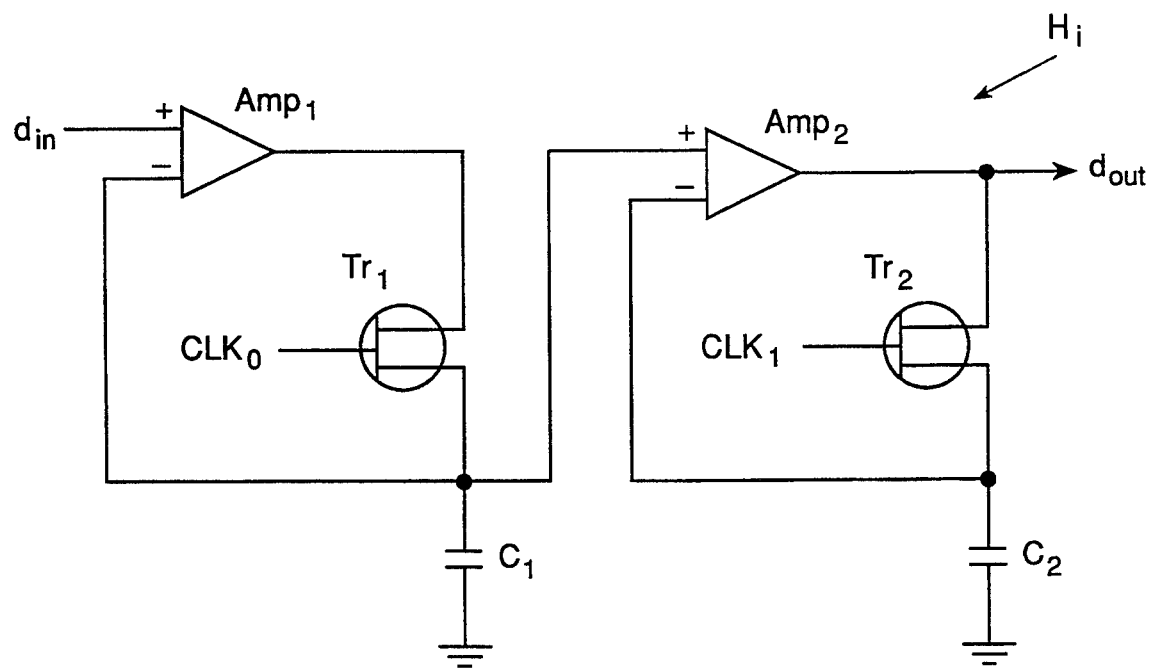
FIG. 2 is a diagram of a holding circuit used in the embodiment illustrated in FIG. 1.

FIG. 2 shows an embodiment of holding circuit "$H_{jk}$". "$H_{jk}$" comprises a pair of operational amplifiers "$Amp_1$" and "$Amp_2$" and a pair of field effect transistor "$Tr_1$" and "$Tr_2$". Input data "$d_{in}$" is input to the non-inverse input of "$Amp_1$". An output of "$Amp_1$" is connected to the drain of "$Tr_1$", whose source is grounded through capacitance "$C_1$" as well as is fed back to the inverse input of "$Amp_1$". Clock "$CLK_0$" is input to the gate of "$Tr_1$", which becomes conductive when "$CLK_0$" is high level. When "$Tr_1$" is conductive, an output of "$Amp_1$" is controlled so that the voltage equal to "$d_{in}$" is impressed on "$C_1$", and electrical charge is stored in "$C_1$" so that the voltage of charging is "$d_{in}$".

The charged voltage of "$C_1$" is connected to non-inverse input of "$Amp_2$", whose output is connected to the drain of "$Tr_2$". The source of "$Tr_2$" is grounded through capacitance "$C_2$", as well as is fed back to the inverse input of "$Amp_2$". Clock "$CLK_1$" of the inverse phase of "$CLK_0$" is input to the gate of "$Tr_2$", which becomes conductive in inverse phase of "$Tr_1$". When "$Tr_2$" is conductive, a) an output of "$Amp_2$" is controlled so that the voltage equal to "$d_{in}$" of the voltage for charging "$C_1$" is impressed on the voltage for charging "$C_2$", b) electrical charge is stored in "$C_2$" so that the voltage for charging is "$d_{in}$" by a), and c) "$d_{out}$" is output corresponding to "$d_{in}$". Holding can be surely performed by the predetermined timing because "$d_{in}$" is held in one clock timing and there is no influence in the following steps when "$C_1$" is charged.

Figure 3:
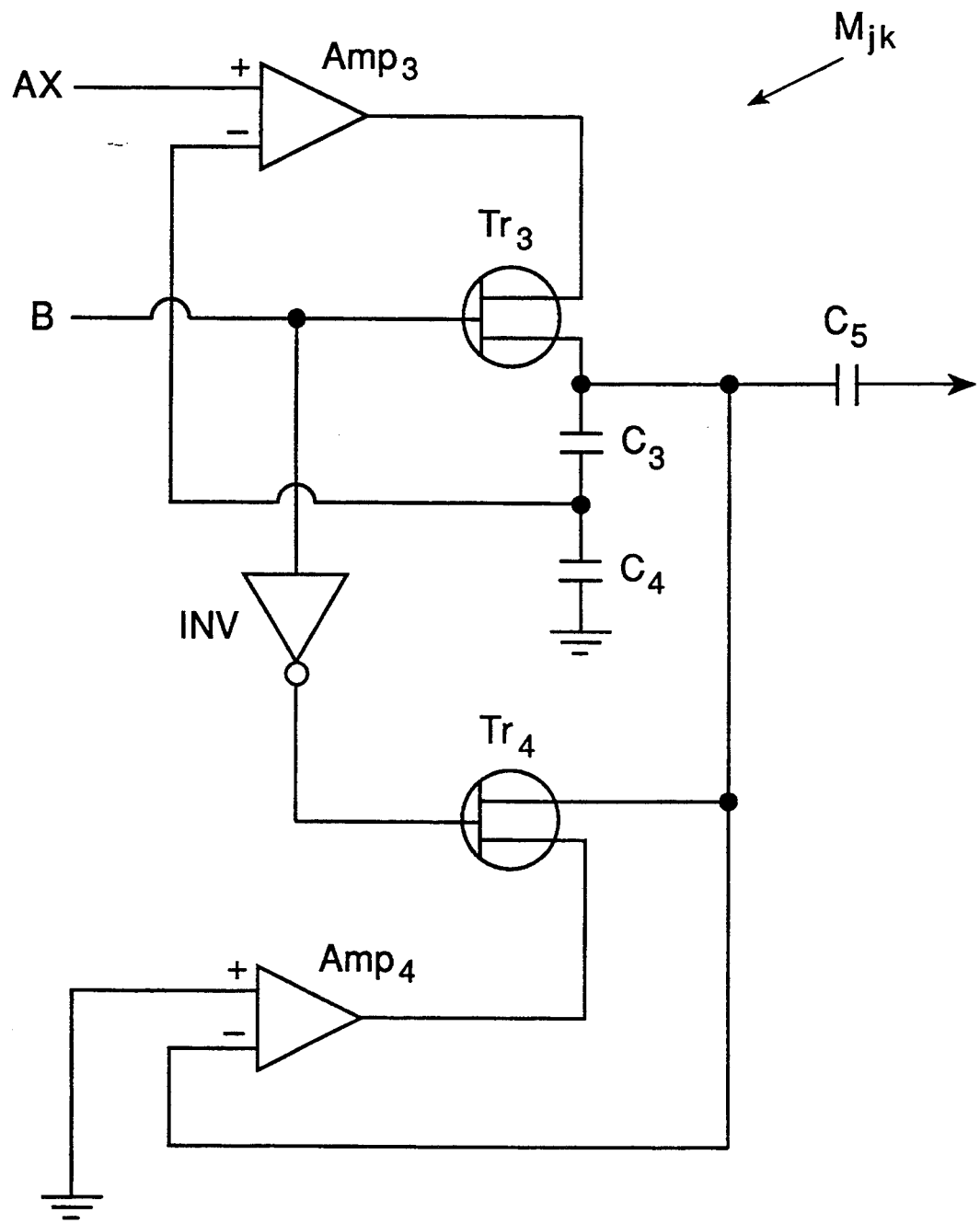
FIG. 3 is a diagram of a multiplication circuit used in the embodiment illustrated in FIG. 1.

FIG. 3 shows an embodiment of multiplication circuit "$M_{jk}$". "$M_{jk}$" comprises a pair of operational amplifiers "$Amp_3$" and "$Amp_4$" and a pair of field effect transistor "$Tr_3$" and "$Tr_3$". Input analog data "AX" is input to the non-inverse input of "$Amp_3$". An output of "$Amp_3$" is ocnnected to the drain of "$Tr_3$", whose source is grounded through capacitances "$C_3$" and "$C_4$". The voltage between "$C_3$" and "$C_4$" is fed back to the inverse input of "$Amp_3$". Digital input "B" is input to the gate of "$Tr_3$", which becomes conductive when "B" is high level. When "$Tr_3$" is conductive, an output of "$Amp_3$" is controlled so that the voltage equal to "AX" is impressed on "$C_4$", and electrical charge is stored in "$C_4$" so that the voltage for charging is "AX". Here, the source voltage of "$Tr_3$" is as below.

$$AX\{(C_3-C_4)/C_3\}$$

The non-inverse input of "$Amp_4$" is grounded and an output of it is connected to the source of "$Tr_4$". The drain of "$Tr_4$" is connected to "$C_3$", as well as fed back to the inverse input of "$Amp_4$". Digital data inverted "B" by inverter "INV" is input to the gate of "$Tr_4$", which is conductive when "B" is low level. When "$Tr_4$" is conductive, the output of "$Amp_4$" is controlled in order that 0 V is generated in the drain of "$Tr_4$".

The source of "$Tr_3$" and the drain of "$Tr_4$" is connected to "$C_5$" of the capacitance for output. The voltage value multiplied the weight which is determined by capacitive coupling including "$C_5$" is the output. It means that "$M_{jk}$" has performed the multiplication with the multiplier shown below or 0.

$$\{(C_3-C_4)/C_3\}C_{cp}$$

Figure 4:
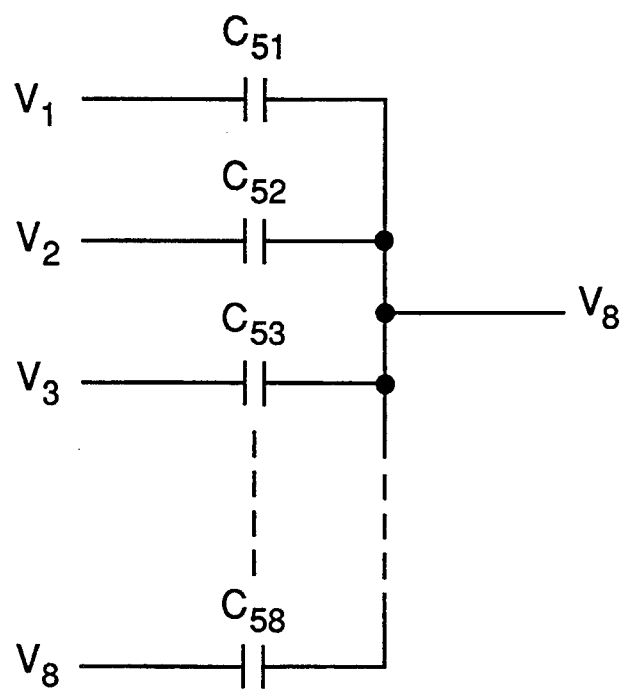
FIG. 4 is a diagram of a capacitive coupling circuit.

$C_{cp}$ is a weight determined by capacitive coupling. "Capacitive coupling" means such a structure in FIG. 4, having a plural number of capacitances (from "$C_{51}$" to "$C_{58}$", here) connected in parallel. When voltage from "$V_1$" to "$V_8$" is impressed on these capacitances, output voltage "$V_8$" is the value calculable by the formula below.

$$V_8=(C_{51}V_1+C_{52}V_2+ \ldots +C_{58}V_8)/(C_1+C_2+ \ldots C_8)$$

This formula means that weighted summation is executed.

The multiplication of analog data "AX" and digital data can be directly performed by setting a circuit shown in FIG. 3 by a plural number in parallel, inputting each bit of digital data as "B", and setting $\{(C_3-C_4)/C_3\}C_{cp}$ to be $2^n$.

Figure 5:
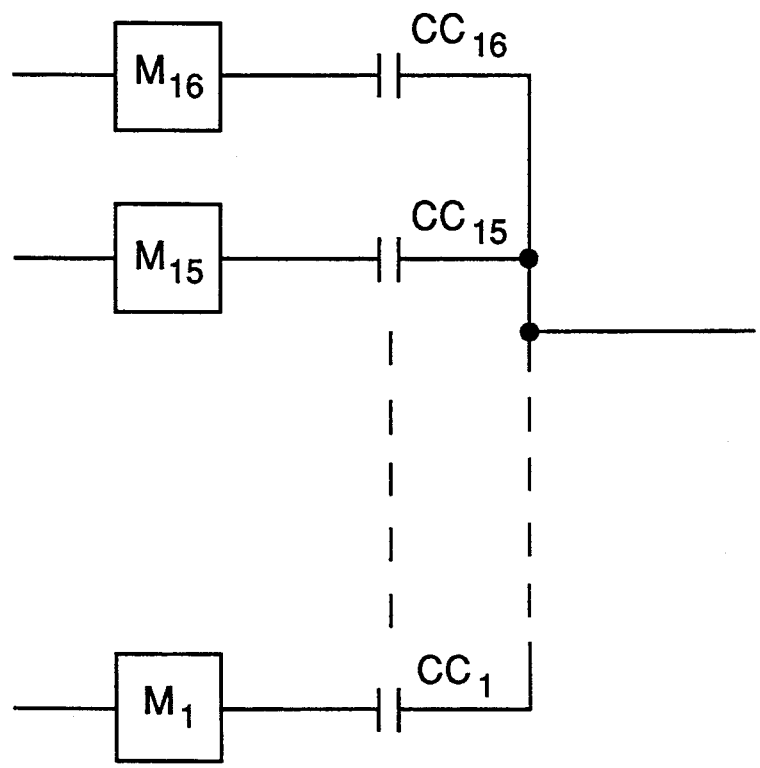
FIG. 5 is a diagram of an additional circuit used in the embodiment illustrated in FIG. 1.

An adding circuit is structured as in FIG. 5. It comprises multiplication circuits from "$M_1$" to "$M_{16}$" combined by capacitive coupling in which capacitances from CC1 to CC16 are connected in parallel. The total summation of multiplication is calculated in the same way as in FIG. 4.

As mentioned above, a multiplier of each multiplication circuit is stored in shift register and multiplication is successively executed with various multipliers in a multiplication circuit by circulating multipliers in the filter circuit of this invention. Therefore, it is possible to control the holding error at the minimum.

What is claimed is:

1. A filter circuit for holding a plurality of successive analog input data in time series and for performing multiplication by multiplying said data by a multiplier in time series, comprising:
   i) a plurality of holding circuits for holding input data:
   ii) a plurality of multiplication circuits, wherein each multiplication circuit is associated with one of said holding circuits such that each multiplication circuit is connected to receive an output from said associated holding circuit;
   iii) a shift register having a plurality of data areas, wherein each data area corresponds to one of said multiplication circuits, data of each data area being input to each multiplication circuit as a multiplier therein, data in each data area being transferred to an adjacent data area, as well as being fed back to an initial data area when said data has been transferred to an ending data area in said shift register; and
   iv) an addition circuit for calculating a total summation of an output of each of said multiplication circuits.

2. A filter circuit as defined in claim 1, wherein said holding circuit is divided into a first holding circuit group and a second holding circuit group, said first holding circuit group including a plurality of individual holding circuits for holding first input data input thereto and said second holding group including a plurality of individual holding circuits for holding second input data input thereto, said second input data corresponding to one of said first input data and a output from said addition circuit, and further comprising a switching means for selecting one of said first input data and said output from said addition circuit, an output of said switching means being input to said second holding circuit group as said second input data.

3. A filter circuit as defined in claim 2, wherein said addition circuit comprises a single addition circuit to which all of said outputs of said multiplication circuits are input.

4. A filter circuit as defined in claim 3, wherein said addition circuit comprises a capacitive coupling circuit including a plurality of capacitances connected in parallel.

5. A filter circuit as defined in claim 1, wherein said addition circuit comprises one addition circuit to which all of said outputs of said multiplication circuit are input.

6. A filter circuit as defined in claim 1, wherein said addition circuit comprises a capacitive coupling including a plurality of capacitances connected in parallel.

* * * * *